United States Patent
Wang (10) Patent No.: US 9,446,331 B2
(45) Date of Patent: Sep. 20, 2016

(54) SYSTEM AND METHOD FOR DISPENSING PHOTORESIST

(71) Applicant: Taiwan Semiconductor Manufacturing Co., Ltd., Hsin-Chu (TW)

(72) Inventor: Chung-Cheng Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 501 days.

(21) Appl. No.: 13/925,896

(22) Filed: Jun. 25, 2013

(65) Prior Publication Data

US 2014/0260963 A1 Sep. 18, 2014

Related U.S. Application Data (60) Provisional application No. 61/787,472, filed on Mar. 15, 2013.

(51) Int. Cl.
| | | |
|---|---|---|
| *B01D 19/00* | (2006.01) | |
| *B01D 35/02* | (2006.01) | |
| *G03F 7/26* | (2006.01) | |
| *G03F 7/16* | (2006.01) | |

(52) U.S. Cl.
CPC ....... *B01D 19/0031* (2013.01); *B01D 19/0063* (2013.01); *B01D 35/02* (2013.01); *G03F 7/26* (2013.01); *G03F 7/16* (2013.01)

(58) Field of Classification Search
None
See application file for complete search history.

(56) References Cited

U.S. PATENT DOCUMENTS

| | | | | |
|---|---|---|---|---|
| 5,618,348 A | * | 4/1997 | Tran | B08B 9/027 118/693 |
| 6,336,960 B1 | * | 1/2002 | Marinaro | B01D 36/001 210/436 |
| 6,848,458 B1 | * | 2/2005 | Shrinivasan | H01L 21/67057 134/103.1 |
| 8,580,117 B2 | * | 11/2013 | Kao | G03F 7/162 210/141 |

FOREIGN PATENT DOCUMENTS

WO 2009047960 A1 4/2009

OTHER PUBLICATIONS

Compact Resist Dispense System Training Manual, Editor: Tokyo Electron Kyushu Ltd., Training Gr. Advanced Operation Office, Aug. 2008, pp. 1-14.

* cited by examiner

*Primary Examiner* — Duane Smith
*Assistant Examiner* — Phillip Shao
(74) *Attorney, Agent, or Firm* — Duane Morris LLP; Steven E. Koffs (57) ABSTRACT

A system comprises: a filter for removing at least one of a contaminant or gas bubbles from a liquid photoresist to provide a filtered photoresist at an outlet of the filter. The filter has a filter vent. A trap has an inlet coupled to receive the filtered photoresist from the filter, for removing a remaining contaminant or gas bubbles from the filtered photoresist. One or more valves and one or more conduits are connected to the filter and the trap. The one or more valves are operable to reverse a direction of flow of the filtered photoresist, so that the photoresist flows from the inlet of the trap, through the outlet of the filter, to the filter vent.

20 Claims, 5 Drawing Sheets

SYSTEM AND METHOD FOR DISPENSING PHOTORESIST

This application claims the benefit of priority of U.S. Provisional Application No. 61/787,472, filed Mar. 15, 2013, which is incorporated by reference herein in its entirety.

FIELD

This disclosure relates to apparatus and methods for dispensing photoresist onto a semiconductor substrate.

BACKGROUND

In order to dispense a stable flow of photoresist in semiconductor processing, gas powered pumps are used for dispensing photoresist. Gas powered pumps can provide a constant dispensing pressure, avoiding small variations that occur with an impeller powered pump. The resist dispensing pump uses a plurality of electronically controlled valves to control the pressure before and after pumping to stabilize the dispenser action.

One example of a resist dispensing pump is the Advanced Compact Resist Dispense (ACRD) system sold by Tokyo Electron Kyushu, Ltd., of Koshi, Kumamoto, Japan. The ACRD system operates on a four step cycle. Prior to dispensing, the photoresist in the pump is pre-pressurized. During the dispense step, the pressurized photoresist is dispensed. Following dispensing, a system time delay is incurred. Lastly, after the pump has completed dispensing the pump is refilled with photoresist.

Although the ACRD pump has improved dispensing pressure stability relative to an impeller powered pump, it is still subject to bubble formation.

DETAILED DESCRIPTION

This description of the exemplary embodiments is intended to be read in connection with the accompanying drawings, which are to be considered part of the entire written description. In the description, relative terms such as "left," "right," "front," "back," as well as derivative thereof should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1:
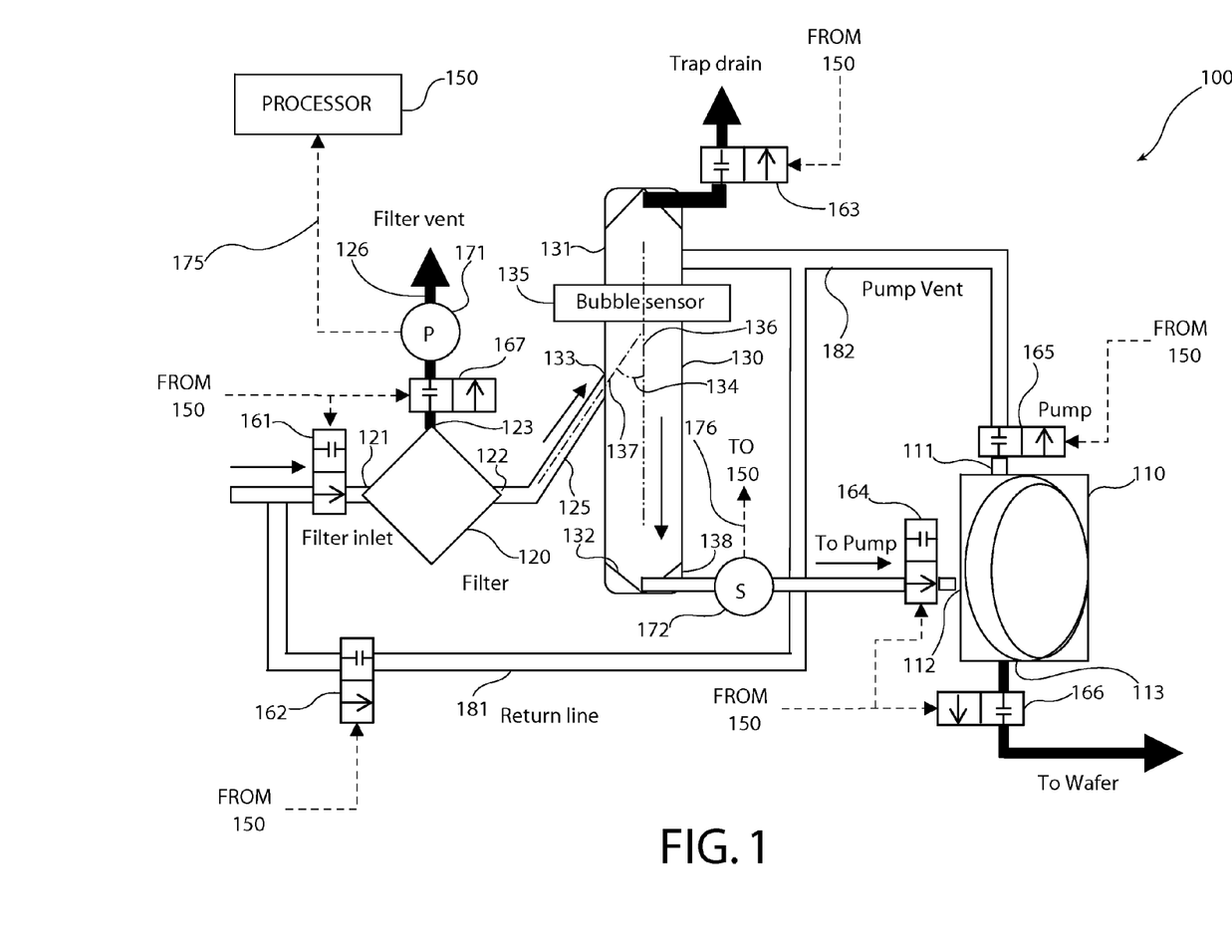
FIG. 1 is a schematic view of a pump system in configured for normal operation.

FIG. 1 is a schematic diagram of a resist dispensing system 100.

The resist dispensing system 100 includes a filter 120 for removing at least one of a contaminant or gas bubbles from a liquid photoresist, before the photoresist is passed to a pump 110 for dispensing. The filter 120 receives the photoresist at an inlet 121 of the filter to provide a filtered photoresist at an outlet 122 of the filter 120. The outlet 122 of the filter 120 has a height which is lower than the inlet 133 of the trap 130. The filter 120 has a filter vent port 123. A photoresist filter 120 sold by Mykrolis Corporation, San Diego, Calif. or Pall Corporation of Port Washington, N.Y. can be used.

The resist dispensing system 100 further includes a trap 130 (also referred to as a "mini-trap" having an inlet 133 coupled to receive the filtered photoresist from the filter 120, for removing a remaining contaminant or gas bubbles from the filtered photoresist. The trap 130 avoids contamination of the pump 110 from the filter 120. In normal operation, the photoresist enters the trap 130 near the top of the trap and is drawn from the bottom of the trap to be fed to the pump 110. Thus, bubbles in the mini-trap remain at the top, and are substantially removed from the photoresist before being fed to the pump. The trap 130 has a vertical axis 136, and the inlet 133 of the trap 130 has a longitudinal axis 137 oriented about 90 degrees or less from the vertical axis 136 of the trap 130 (i.e., the angle 134 is about 90 degrees or less).

In some embodiments, the trap 130 has an interior horizontal dimension that gradually decreases near a top end 131 of the trap 130. In some embodiments, the trap 130 has an interior horizontal dimension that gradually decreases near a bottom end 132 of the trap 130. In some embodiments, the trap 130 has an interior chamber which is conical at a top end 131 thereof and conical at a bottom end 132 thereof. The cone or funnel shape can easily purge bubbles and impurities from the top end 131 of the trap, and also can prevent the resist flow from stagnating in the bottom corner side 132 of the trap 130. Stagnation (idle resist) could otherwise be caused by low flow rate (low filtration, low dispense rate, and/or low resist consumption). In other embodiments (not shown), the top and/or bottom ends of the mini trap have a curvature when viewed in a vertical cross-section. For example, the top and/or bottom interior surface of the trap 130 can be a paraboloid or half-ellipsoid.

The system includes a pump 110, downstream from the filter 120, and coupled to at least one outlet of the trap for receiving and dispensing the filtered photoresist. In some embodiments, the pump 110 is a gas-pressure-driven pump. The pump 110 has a vent port 111. In some embodiments, the pump 110 is an ACRD system sold by Tokyo Electron Kyushu, Ltd., of Koshi, Kumamoto, Japan.

The system has one or more valves 161-167 and one or more conduits 181-182 connected to the filter 120 and the trap 130. The one or more valves 161-167 are operable to reverse a direction of flow of the filtered photoresist, so that the photoresist flows from the inlet 133 of the trap 130, through the outlet 122 of the filter 120, to the filter vent port 123.

The resist dispensing system 100 includes one or more conduits (e.g., 181, 182) interconnecting the various elements. In some embodiments, the conduits include a straight section of conduit 125 extending from the outlet 122 of the filter to the inlet 133 of the trap 130. The straight section of conduit 125 is aligned along the longitudinal axis 137 of the inlet 133 of the trap 130 (i.e., at an angle 134 about 90 degrees or less from the vertical axis 136

In some embodiments, the one or more conduits include a return line 181 connecting the vent port 111 of the pump 110 to the inlet 121 of the filter 120. This allows the returned photoresist from the pump 110 to be passed through the filter 120 again, instead of being mixed with the filtered photoresist at the outlet of the trap 130. The filtered resist can be isolated in the return line 181. There is no need to disable dispensing during self-circulation of the photoresist from the pump vent 111 back to the filter 120.

In some embodiments, the resist dispensing system 100 has a pressure sensor 172 coupled to the filter vent port 123. The pressure sensor 172 is configured to output a signal 175 indicative of filter pressure to a controller or processor 150. In some embodiments, the pressure sensor 172 detects a pressure change when the pump 110 is reloaded with resist. In some embodiments, the processor 150 uses the signal to determine whether the direction of flow of the filtered photoresist should be reversed to wash the filter. If the filter 120 becomes clogged with bubbles or contamination, the downstream pressure measured by sensor 172 decreases. Thus, a decrease in pressure indicates that a reverse flow filter wash operation should be performed. For example, in some embodiments, a normal pressure at the location of sensor 172 is 22 KPa. A reduction in pressure to about 20 KPa or less indicates that a cleaning should be performed.

In some embodiments, the resist dispensing system 100 includes a liquid particle counter 171 coupled between the at least one outlet 138 of the trap 130 and the pump 110, to detect the resist particle level. The liquid particle counter 171 is configured to output a signal 176 indicative of when to terminate reverse flow of the filtered photoresist from the trap to the filter. Thus, the resist filtration can be monitored in real-time.

In some embodiments, a processor 150 is included for automatic control of the system. In some embodiments, the processor 150 is programmed to receive the signals from the sensor 172 and, if a value of the signals exceeds a threshold, operate the one or more valves to reverse a direction of flow of the filtered photoresist, so that the photoresist flows from the inlet of the trap, through the outlet of the filter, to the filter vent. The control algorithm executed by the processor 150 is described below with reference to FIG. 7.

Figure 2:
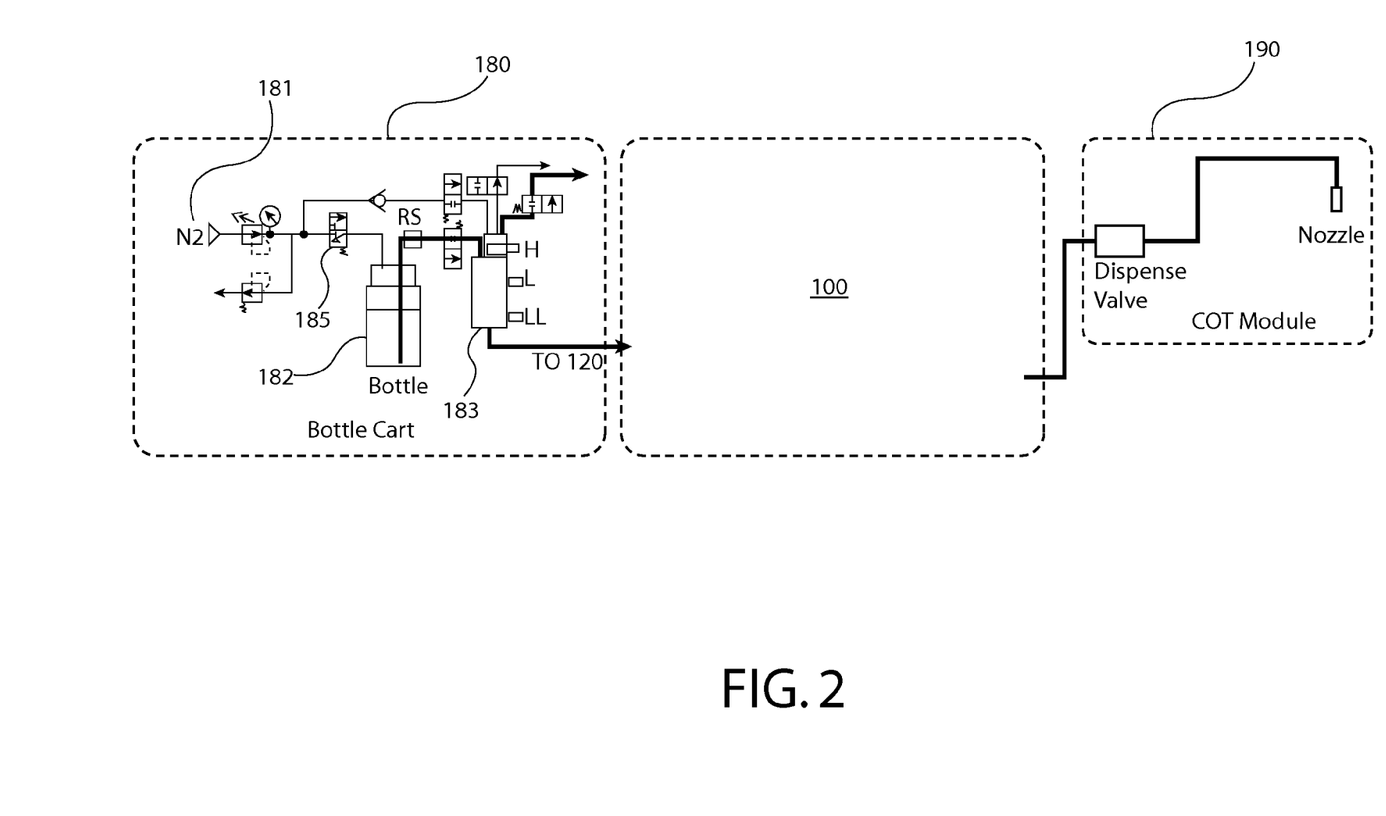
FIG. 2 is a schematic view showing the pump system of FIG. 1 in an operating environment.

FIGS. 1 and 2 show the normal operation mode of the resist dispensing system 100. The resist dispensing system 100 is intended to dispense filtered photoresist at a constant pressure with reduced bubbles. The pump 110 uses pressurized gas (e.g., $N_2$) to dispense the photoresist, instead of an impeller. The electronically controlled valves 161-167 control flow direction and pressure before and after dispensing photoresist.

FIG. 2 shows an example of a dispensing configuration 200 including a nitrogen bottle cart 180 and a coating (COT) module 190. The bottle cart 180 includes a source 181 of pressurized inert gas, such as nitrogen, which can be a supply tank. One or more control valves 185 admit the nitrogen to the system 200. A bottle 182 contains a supply of the photoresist to be dispensed. The system can be used for any liquid photoresist, including positive or negative types. A reservoir 183 maintains the photoresist at a desired level.

The COT module 190 applies the photoresist to a surface of a semiconductor substrate (e.g., a silicon wafer). In some embodiments, the COT module 190 includes a dispensing valve and a nozzle.

As shown in FIGS. 1 and 2, upon opening of the valve 185, the nitrogen from supply 181 applies pressure in the bottle 182 to deliver the resist to the reservoir 183. The photoresist is delivered from the bottom of the bottle 182, to allow the nitrogen to rise to the top of the bottle 182 and minimize dispensing of nitrogen in the photoresist to the reservoir 183. From the reservoir 183, the photoresist is fed to the filter inlet 121 by way of a valve 161, which is open during normal operation to admit photoresist into the filer 120. A valve 162 in the pump return line 181 is in the closed position, and the valve 167 between the filter 120 and the filter vent port 123 is closed, so the photoresist can only flow through the filter 120. The filter 120 removes contaminants and bubbles from the photoresist. Over an extended period, as impurities collect in the filter, the pressure in filter 123 increases. This pressure increase can increase the amount of bubbles or dissolved nitrogen in the photoresist.

The filter 120 feeds the photoresist up through the straight, inclined section of conduit 125 into the trap 130. Because the conduit 125 is straight and slanted, bubbles in the conduit 125 rise and are easily passed through to the top of the trap 130, facilitating flow. With bubbles remaining in the conduit 125 for a relatively short time, improved defect control is achieved. Because the section of conduit 125 is straight and inclined, bubbles do not accumulate at a horizontal section of the conduit 125.

During normal operations, the system is operated as follows. For refilling the pump (and pre-pressurization), valves 161 and 164 are open as shown in FIG. 1, and the remaining valves 162-163 and 165-167 are closed. The photoresist flows through the filter 120 in the forward direction during this stage. To dispense the photoresist, the valve 166 is opened, and valves 161-165 and 167 are closed. No filtration is performed during the dispense step. To vent the pump to the return line, valves 165 and 162 are opened, and the remaining valves 161, 163-164 and 166-167 are closed. To vent the pump to the drain, valves 165 and 163 are open, and the remaining valves 161-162, 164 and 166-167 are closed.

In some embodiments, backflow operations are used to clean the filter 120. Using the backflow function can quickly remove the bubbles inside of filter 120 immediately after a new filter installation. During filter installation, the reverse-flow flush function can provide a different photoresist flow path to remove bubbles. It can reduce time for removing bubbles from the tool, and allow the user to more efficiently install the filter to achieve defect reduction targets.

Figure 3:
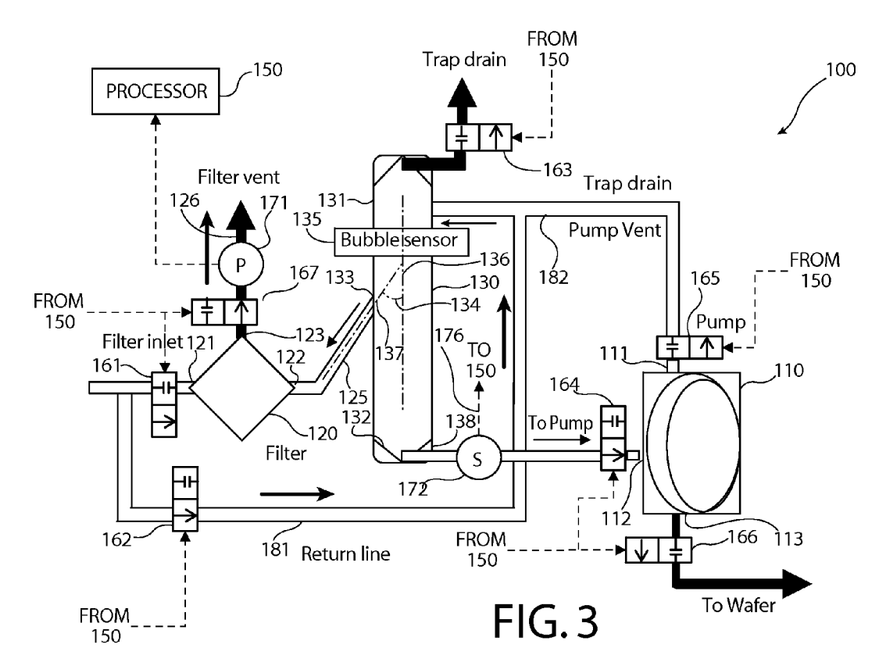
FIG. 3 is a schematic view of the pump system of FIG. 1, configured for a reverse flow operation during filter installation.

In some embodiments, as shown in FIG. 3, a nitrogen purge operation at the time of filter installation includes opening the valve 162 in the return line and the valve 167 at the filter vent port 123. The remaining valves are closed, including the filter inlet valve 161, the trap drain valve 163, and the pump valves 164-166. The incoming photoresist from the bottle cart 180 is transmitted through the return line 181 to the top of the mini trap 130, out from the trap inlet 133, through the conduit 125, through the filter 120, and out of the filter vent port 123.

Some embodiments provide a resist backflow function to reverse-wash the filter 120 if the value of the sensor signal from pressure sensor 172 is over a threshold value. Triggering reverse-flow washing of the filter 120, based on the signal from the sensor 172 can extend filter life time.

Figure 4:
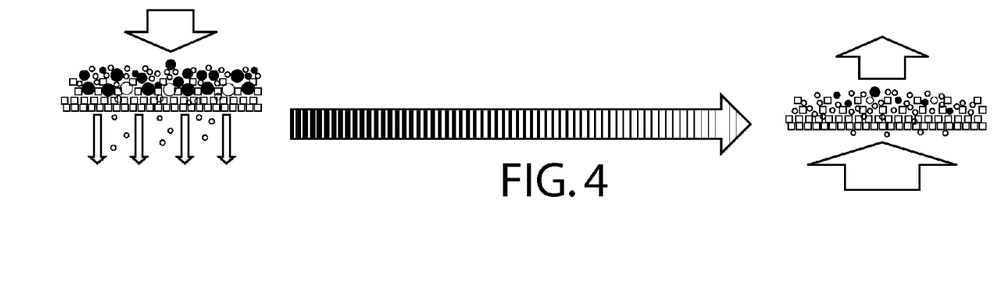
FIG. 4 is a schematic view showing the filter of FIG. 3 before and after reversal of the flow.

FIG. 4 schematically shows how the accumulation of bubbles (left side) is reduced when the flow direction is reversed (right side) at the time of installing a new filter 120.

Figure 5:
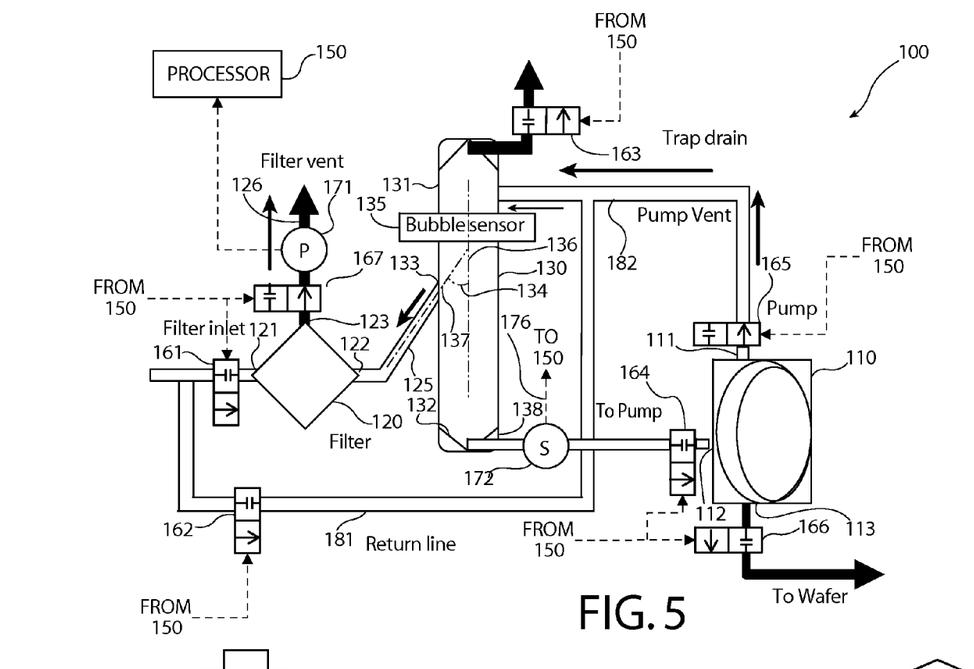
FIG. 5 is a schematic view of the pump system of FIG. 1, configured for a reverse flow operation when filter contaminant or bubble levels become excessive.

FIG. 5 shows an example of the resist back flow path for reverse washing the filter in response to the signal 176 from the pressure sensor 172. The valves 165 and 167 are opened, and the remaining valves 161-164 and 166 are closed. The fluid from the pump vent 111 flows through valve 165, line 182, into the trap 130, out through the trap inlet 133, through the outlet 121 of filter 120, and exits the filter vent port 123.

Some embodiments also use the liquid particle count from sensor 171 provide information to stop the reverse resist flow filter-washing mode. The liquid particle counter 171 can monitor the resist particle level after filter vent port 123. This information can provide a signal to processor 150 to stop the reverse-flow washing of the filter 120 by the photoresist.

Figure 6:
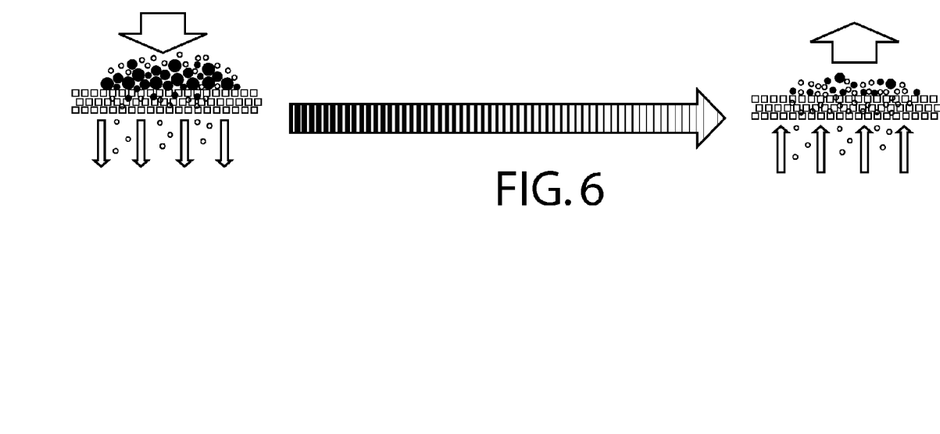
FIG. 6 is a schematic view showing the filter of FIG. 5 before and after reversal of the flow.

FIG. 6 schematically shows how the accumulation of impurities (left side) is reduced when the flow direction is reversed (right side).

In some embodiments, an operator manually monitors the pressure sensor 172 and liquid particle counter 171, and controls the valves 161-167 as desired to maintain the system 100. In other embodiments, the monitoring and control is performed automatically by the processor 150.

Figure 7:
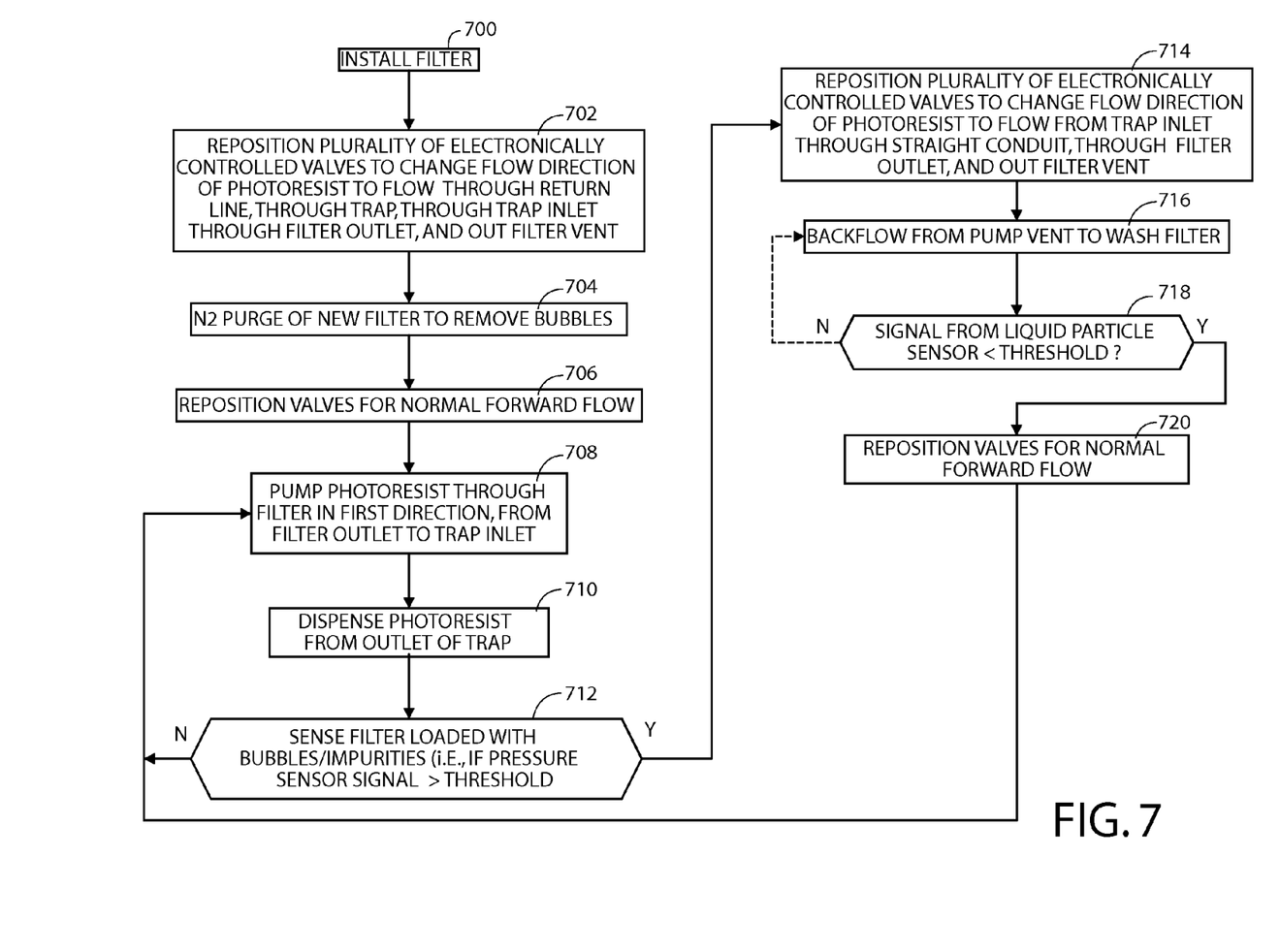
FIG. 7 is a flow chart showing installation, cleaning, normal operation and washing of the photoresist filter of FIG. 1.

FIG. 7 is a flow chart of a method. In some embodiments, the processor 150 is programmed to initiate each of the steps of FIG. 7. The processor 150 can be any microcomputer, embedded processor, or application specific integrated circuit (ASIC), equipped with a non-transitory, machine readable storage medium (e.g., flash memory, hard disk drive or the like). The storage medium contains computer program code and data to configure the processor to perform the steps of FIG. 7.

At step 700, a new filter 120 is installed. The new filter can be installed when a new system 100 is installed, or at any subsequent time.

At step 702, a flow direction of the photoresist is changed, so as to flow from the inlet of the trap through the outlet of the filter, and out a vent of the filter. For example, in a configuration as shown in FIG. 3, a plurality of electronically controlled valves are repositioned so that valves 162 and 167 are open, and valves 161, and 163-166 are closed, to change the flow direction of the photoresist to flow through the return line 181, through the trap 130, through the trap inlet 133, through the filter outlet 122, and out the filter vent 123.

At step 704, photoresist is pumped through the filter in a first direction, so that the photoresist flows from an outlet of the filter into an inlet of a trap, so as to perform a nitrogen purge on the new filter to remove bubbles.

At step 706, the valves are repositioned for normal operation. For example, to reload resist to the pump 110, valves 161 and 164 are opened, and the remaining valves 162, 163 and 165-167 are closed. This changes the flow direction, so that flow path extends through valve 161, filter inlet 121, filter 120, filter outlet 122, conduit 125, trap 130, valve 164 and pump 110.

At step 708, photoresist is pumped from through the filter 120 in a first direction, from the filter outlet 122 to the trap inlet 133. The pumping step includes pumping the photoresist from the filter to the trap by way of a straight conduit, wherein the straight conduit terminates at the inlet of the trap, and the straight conduit and inlet extend along a common axis which is oriented at an acute angle with respect to a longitudinal axis of the trap.

At step 710, photoresist is dispensed from the outlet of the trap 130.

At step 712, a signal output from a pressure sensor 172 is sensed to determine if the filter 120 is loaded with bubbles or impurities (i.e., if the pressure sensor signal indicates that the pressure is greater than a threshold value). If the pressure is greater than the threshold, step 714 is performed. Otherwise, steps 708 and 710 are repeated. In some embodiments, the processor 150 is programmed to check whether this condition is met, and to reposition the valves accordingly, if appropriate.

At step 714, the plurality of electronically controlled valves are controlled to change the flow direction of the photoresist to flow from the trap inlet through the straight conduit, through the filter outlet, and out of the filter vent. For example, as shown in FIG. 5, valves 165 and 167 are opened, and the remaining valves 161-164 and 166 are closed.

At step 716, the photoresist is flowed in the reverse direction from the pump vent 111, to wash the filter 120. The photoresist is returned directly from a pump which performs the dispensing to an inlet of the filter.

At step 718, photoresist particles at a position in the trap are sensed using a liquid particle sensor 171. If the level of particles passing the sensor is below a threshold level, then step 720 is performed. Otherwise, step 716 is repeated.

At step 720, the flow direction of the photoresist is returned to the first direction when an output signal of the liquid particle sensor 171 reaches a threshold value. For example, to reload resist to the pump 110, valves 161 and 164 are opened, and the remaining valves 162, 163 and 165-167 are closed.

In some embodiments, a system comprises: a filter for removing at least one of a contaminant or gas bubbles from a liquid photoresist to provide a filtered photoresist at an outlet of the filter, the filter having a filter vent. A trap has an inlet coupled to receive the filtered photoresist from the filter, for removing a remaining contaminant or gas bubbles from the filtered photoresist. One or more valves and one or more conduits are connected to the filter and the trap. The one or more valves are operable to reverse a direction of flow of the filtered photoresist, so that the photoresist flows from the inlet of the trap, through the outlet of the filter, to the filter vent.

In some embodiments, the trap has a vertical axis, and the inlet of the trap has a longitudinal axis oriented about 90 degrees or less from the vertical axis.

In some embodiments, the outlet of the filter has a height which is lower than the inlet of the trap, and the one or more conduits include a straight section of conduit extending to the inlet of the trap. The straight section is aligned along the longitudinal axis of the inlet.

In some embodiments, the trap has an interior horizontal dimension that gradually decreases near a top end of the trap.

In some embodiments, the trap has an interior horizontal dimension that gradually decreases near a bottom end of the trap.

In some embodiments, the trap has an interior chamber which is conical at a top end thereof and conical at a bottom end thereof.

Some embodiments further comprise a pressure sensor coupled to the filter vent. The pressure sensor is configured to output a signal indicative of whether the direction of flow of the filtered photoresist should be reversed to wash the filter.

Some embodiments further comprise a gas-pressure-driven pump coupled to at least one outlet of the trap for receiving and dispensing the filtered photoresist. The pump has a vent port. The one or more conduits include a return line connecting the vent port of the pump to an inlet of the filter.

Some embodiments further comprise a liquid particle counter coupled between the at least one outlet of the trap and the pump. The liquid particle counter is configured to output a signal indicative of when to terminate reverse flow of the filtered photoresist from the trap to the filter.

Some embodiments further comprise a sensor for outputting signals representing one of the group consisting of filter loading and resist particle level of the photoresist exiting the trap, and a processor programmed to receive the signals from the sensor and, if a value of the signals exceeds a threshold, operate the one or more valves to reverse a direction of flow of the filtered photoresist, so that the photoresist flows from the inlet of the trap, through the outlet of the filter, to the filter vent.

In some embodiments, the trap has a vertical axis, and the inlet of the trap has a longitudinal axis oriented about 90 degrees or less from the vertical axis. The one or more conduits include a straight section of conduit extending to the inlet of the trap. The straight section is aligned along the longitudinal axis of the inlet. The outlet of the filter has a height which is lower than the inlet of the trap. The trap has an interior horizontal dimension that gradually decreases near a top end of the trap and an interior horizontal dimension that gradually decreases near a bottom end of the trap. The system further comprises a pressure sensor coupled to the filter vent. The pressure sensor is configured to output a signal indicative of whether the direction of flow of the filtered photoresist should be reversed to wash the filter. A gas-pressure-driven pump is coupled to at least one outlet of the trap for receiving and dispensing the filtered photoresist. The pump has a vent port, wherein the one or more conduits include a return line connecting the vent port of the pump to an inlet of the filter. A liquid particle counter is coupled between the at least one outlet of the trap and the pump. The liquid particle counter is configured to output a signal indicative of when to terminate reverse flow of the filtered photoresist from the trap to the filter.

In some embodiments, a system comprises a filter for removing at least one of a contaminant or gas bubbles from a liquid photoresist to provide a filtered photoresist at an outlet of the filter, the filter having a filter vent. A trap has an inlet coupled to receive the filtered photoresist from the filter, for removing a remaining contaminant or gas bubbles from the filtered photoresist. The trap has a vertical axis, and the inlet of the trap has a longitudinal axis oriented about 90 degrees or less from the vertical axis. The outlet of the filter has a height which is lower than the inlet of the trap, and a straight section of conduit receiving filtered photoresist from the filter and extending to the inlet of the trap. The straight section is aligned along the longitudinal axis of the inlet.

In some embodiments, the trap has an interior horizontal dimension that gradually decreases near a top end of the trap.

In some embodiments, the trap has an interior horizontal dimension that gradually decreases near a bottom end of the trap.

In some embodiments, the trap has an interior chamber which is conical at a top end thereof and conical at a bottom end thereof.

In some embodiments, a method comprises pumping photoresist through a filter in a first direction, so that the photoresist flows from an outlet of the filter into an inlet of a trap; dispensing photoresist from an outlet of the trap; and changing a flow direction of the photoresist, so as to flow from the inlet of the trap through the outlet of the filter, and out a vent of the filter.

Some embodiments further comprise sensing a condition in which the filter is loaded with at least one of the group consisting of gas bubbles and impurities, wherein the changing of the flow direction is performed in response to sensing the condition.

Some embodiments further comprise sensing photoresist particles at a position in the trap using a liquid particle sensor; and returning the flow direction of the photoresist to the first direction when an output signal of the liquid particle sensor reaches a threshold value.

Some embodiments further comprise returning photoresist directly from a pump which performs the dispensing to an inlet of the filter.

In some embodiments, the pumping step includes pumping the photoresist from the filter to the trap by way of a straight conduit, wherein the straight conduit terminates at the inlet of the trap, and the straight conduit and inlet extend along a common axis which is oriented at an acute angle with respect to a longitudinal axis of the trap.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A system comprising:
  a filter for removing at least one of a contaminant or gas bubbles from a liquid photoresist to provide a filtered photoresist at an outlet of the filter, the filter having a filter vent;
  a trap having an inlet coupled to receive the filtered photoresist from the filter, for removing a remaining contaminant or gas bubbles from the filtered photoresist;
  one or more valves and one or more conduits connected to the filter and the trap, the one or more valves operable to reverse a direction of flow of the filtered photoresist, so that the photoresist flows from the inlet of the trap, through the outlet of the filter, to the filter vent; and a pump coupled to at least one outlet of the trap for receiving and dispensing the filtered photoresist, the pump having a vent port, wherein the one or more conduits include a return line connecting the vent port of the pump to an inlet of the filter.

2. The system of claim 1, wherein the trap has a vertical axis, and the inlet of the trap has a longitudinal axis oriented diagonally.

3. The system of claim 2, wherein:

the outlet of the filter has a height which is lower than the inlet of the trap, and the one or more conduits include a straight section of conduit extending to the inlet of the trap, the straight section aligned along the longitudinal axis of the inlet, such that the filtered photoresist exits the filter before entering the straight section of conduit.

4. The system of claim 1, wherein the trap has an interior horizontal dimension that gradually decreases near a top end of the trap.

5. The system of claim 1, wherein the trap has an interior horizontal dimension that gradually decreases near a bottom end of the trap.

6. The system of claim 1, wherein the trap has an interior chamber which is conical at a top end thereof and conical at a bottom end thereof.

7. The system of claim 1, further comprising a pressure sensor coupled to the filter vent, the pressure sensor configured to output a signal indicative of whether the direction of flow of the filtered photoresist should be reversed to wash the filter.

8. The system of claim 1, wherein the pump is a gas-pressure-driven pump.

9. The system of claim 1, further comprising a liquid particle counter coupled between the at least one outlet of the trap and the pump, the liquid particle counter configured to output a signal indicative of when to terminate reverse flow of the filtered photoresist from the trap to the filter.

10. The system of claim 1, further comprising:

a sensor for outputting signals representing one of the group consisting of filter loading and resist particle level of the photoresist exiting the trap; and a processor programmed to receive the signals from the sensor and, if a value of the signals exceeds a threshold, operate the one or more valves to reverse a direction of flow of the filtered photoresist, so that the photoresist flows from the inlet of the trap, through the outlet of the filter, to the filter vent.

11. The system of claim 1, wherein:

the trap has a vertical axis, and the inlet of the trap has a longitudinal axis oriented about 90 degrees or less from the vertical axis;

the one or more conduits include a straight section of conduit extending to the inlet of the trap, the straight section aligned along the longitudinal axis of the inlet;

the outlet of the filter has a height which is lower than the inlet of the trap;

the trap has an interior horizontal dimension that gradually decreases near a top end of the trap and an interior horizontal dimension that gradually decreases near a bottom end of the trap;

the system further comprising a pressure sensor coupled to the filter vent, the pressure sensor configured to output a signal indicative of whether the direction of flow of the filtered photoresist should be reversed to wash the filter;

the pump is a gas-pressure-driven pump; and a liquid particle counter coupled between the at least one outlet of the trap and the pump, the liquid particle counter configured to output a signal indicative of when to terminate reverse flow of the filtered photoresist from the trap to the filter.

12. A method of using the system of claim 1, comprising:

pumping the photoresist through the filter in a first direction, so that the photoresist flows from the outlet of the filter into the inlet of a trap;

dispensing the photoresist from an outlet of the trap; and changing a flow direction of the photoresist, so as to flow from the inlet of the trap through the outlet of the filter, and out the filter vent.

13. The method of claim 12, further comprising sensing a condition in which the filter is loaded with at least one of the group consisting of gas bubbles and impurities, wherein the changing of the flow direction is performed in response to sensing the condition.

14. The method of claim 13, further comprising:

sensing photoresist particles at a position in the trap using a liquid particle sensor; and returning the flow direction of the photoresist to the first direction when an output signal of the liquid particle sensor reaches a threshold value.

15. The method of claim 12, further comprising:

returning photoresist directly from a pump which performs the dispensing to an inlet of the filter.

16. The method of claim 12, where the pumping step includes pumping the photoresist from the filter to the trap by way of a straight conduit, wherein the straight conduit terminates at the inlet of the trap, and the straight conduit and inlet extend along a common axis which is oriented at an acute angle with respect to a longitudinal axis of the trap.

17. The system of claim 1, wherein:

the trap has a vertical axis, and the inlet of the trap has a longitudinal axis oriented less than 90 degrees from the vertical axis, the outlet of the filter has a height which is lower than the inlet of the trap, and the one or more conduits include a straight section of conduit extending to the inlet of the trap, the straight section aligned along the longitudinal axis of the inlet.

18. The system of claim 17, wherein the trap has an interior chamber which is conical at a top end thereof and conical at a bottom end thereof.

19. A system comprising:

a filter for removing at least one of a contaminant or gas bubbles from a liquid photoresist to provide a filtered photoresist at an outlet of the filter, the filter having a filter vent;

a trap having an inlet coupled to receive the filtered photoresist from the filter, for removing a remaining contaminant or gas bubbles from the filtered photoresist, the trap having a vertical axis, and the inlet of the trap has a longitudinal axis oriented less than 90 degrees from the vertical axis;

a diagonal conduit extending from a height of the outlet of the filter to the inlet of the trap; and one or more valves and one or more conduits connected to the filter and the trap, the one or more valves operable to reverse a direction of flow of the filtered photoresist, so that the photoresist flows from the inlet of the trap, through the outlet of the filter, to the filter vent.

20. The system of claim 19, further comprising a sensor for outputting signals representing one of the group consisting of filter loading and resist particle level of the photoresist exiting the trap; and a processor programmed to receive the signals from the sensor and, if a value of the signals exceeds a threshold, operate the one or more valves to reverse a direction of flow of the filtered photoresist, so that the photoresist flows from the inlet of the trap, through the outlet of the filter, to the filter vent.

* * * * *